US009583805B2

(12) United States Patent
Cuadras et al.

(10) Patent No.: US 9,583,805 B2
(45) Date of Patent: Feb. 28, 2017

(54) RF FILTER ASSEMBLY WITH MOUNTING PINS

(71) Applicants: Hugo Enrique Cuadras, Rio Rancho, NM (US); Nam Phan, Rio Rancho, NM (US)

(72) Inventors: Hugo Enrique Cuadras, Rio Rancho, NM (US); Nam Phan, Rio Rancho, NM (US)

(73) Assignee: CTS Corporation, Lisle, IL (US)

( * ) Notice: Subject to any disclaimer, the term of this patent is extended or adjusted under 35 U.S.C. 154(b) by 40 days.

(21) Appl. No.: 14/676,530

(22) Filed: Apr. 1, 2015

(65) Prior Publication Data

US 2015/0207193 A1 Jul. 23, 2015

Related U.S. Application Data

(63) Continuation-in-part of application No. 13/373,862, filed on Dec. 3, 2011, now Pat. No. 9,030,279.
(Continued)

(51) Int. Cl.
*H01P 1/20* (2006.01)
*H01P 7/10* (2006.01)
(Continued)

(52) U.S. Cl.
CPC .............. *H01P 1/2002* (2013.01); *H01P 1/201* (2013.01); *H01P 1/207* (2013.01); *H01P 1/2084* (2013.01);
(Continued)

(58) Field of Classification Search
CPC ......... H01P 1/2002; H01P 7/10; H01P 1/2084; H01P 1/2088; H01P 3/16
(Continued)

(56) References Cited

U.S. PATENT DOCUMENTS 3,882,434 A 5/1975 Levy
3,955,161 A 5/1976 MacTurk
(Continued)

FOREIGN PATENT DOCUMENTS

CN 201898182 U 7/2011
CN 102361113 A 2/2012
(Continued)

OTHER PUBLICATIONS

Ruiz-Cruz J et al: "Rectangular Waveguide Elliptic Filters with Capacitive and Inductive Irises and Integrated Coaxial Excitation", 2005 IEEE MTT-S International Microwave Symposium, Piscataway, NJ, USA, IEEE, (Jun. 12, 2005) pp. 269-272, EP010844740, DOI: 10.1109/MWSYM.2005.1516577, ISBN: 978-0-7803-8846-8 p. 269; figures 1,3.
(Continued)

*Primary Examiner* — Stephen E Jones
*Assistant Examiner* — Rakesh Patel
(74) *Attorney, Agent, or Firm* — Daniel Deneufbourg

(57) ABSTRACT

An RF filter assembly comprising a substrate, an RF waveguide filter mounted on the substrate and a pair of alignment/mounting/RF signal transmission pins extending from respective apertures in the substrate into respective through-holes in the RF filter. In one embodiment, the RF waveguide filter is comprised of first and second blocks of dielectric material coupled together in an abutting side-by-side relationship and the pair of through-holes are defined in the first and second blocks respectively. In one embodiment, respective RF signal transmission pads defined on the respective first and second blocks of dielectric material are abutted against respective RF signal transmission pads defined on the substrate and interconnected by an RF signal transmission line in the interior of the substrate for transmitting the
(Continued)

RF signal between the first and second blocks of dielectric material.

13 Claims, 3 Drawing Sheets

Related U.S. Application Data

(60) Provisional application No. 61/975,754, filed on Apr. 5, 2014.

(51) Int. Cl.
| | |
|---|---|
| H01P 1/201 | (2006.01) |
| H01P 3/16 | (2006.01) |
| H01P 1/208 | (2006.01) |
| H01P 1/207 | (2006.01) |
| H05K 3/40 | (2006.01) |

(52) U.S. Cl.
 CPC ............ *H01P 1/2088* (2013.01); *H01P 3/16* (2013.01); *H01P 7/10* (2013.01); *H05K 3/4046* (2013.01); *H05K 2201/09845* (2013.01); *H05K 2201/1006* (2013.01); *H05K 2201/10303* (2013.01)

(58) Field of Classification Search
 USPC ....................................... 333/202–212, 219.1
 See application file for complete search history.

(56) References Cited

U.S. PATENT DOCUMENTS

| | | | |
|---|---|---|---|
| 4,396,896 | A | 8/1983 | Williams |
| 4,431,977 | A | 2/1984 | Sokola et al. |
| 4,609,892 | A | 9/1986 | Higgins, Jr. |
| 4,692,726 | A | 9/1987 | Green et al. |
| 4,706,051 | A | 11/1987 | Dieleman et al. |
| 4,733,208 | A | 3/1988 | Ishikawa et al. |
| 4,742,562 | A | 5/1988 | Kommrusch |
| 4,800,348 | A | 1/1989 | Rosar et al. |
| 4,806,889 | A | 2/1989 | Nakano et al. |
| 4,837,535 | A | 6/1989 | Konishi et al. |
| 4,940,955 | A | 7/1990 | Higgins, Jr. |
| 4,963,844 | A | 10/1990 | Konishi et al. |
| 4,996,506 | A | 2/1991 | Ishikawa et al. |
| 5,004,992 | A | 4/1991 | Grieco et al. |
| 5,023,944 | A | 6/1991 | Bradley |
| 5,130,682 | A | 7/1992 | Agahi-Kesheh |
| 5,208,565 | A | 5/1993 | Sogo et al. |
| 5,243,309 | A | 9/1993 | L'Ecuyer |
| 5,285,570 | A | 2/1994 | Fulinara |
| 5,288,351 | A | 2/1994 | Hoang et al. |
| 5,365,203 | A | 11/1994 | Nakamura et al. |
| 5,382,931 | A | 1/1995 | Piloto et al. |
| 5,416,454 | A | 5/1995 | McVetty |
| 5,525,946 | A | 6/1996 | Tsujiguchi et al. |
| 5,528,204 | A | 6/1996 | Hoang et al. |
| 5,528,207 | A | 6/1996 | Ito |
| 5,537,082 | A | 7/1996 | Tada et al. |
| 5,572,175 | A | 11/1996 | Tada et al. |
| 5,602,518 | A | 2/1997 | Clifford, Jr. et al. |
| 5,719,539 | A | 2/1998 | Ishizaki et al. |
| 5,731,751 | A | 3/1998 | Vangala |
| 5,821,836 | A | 10/1998 | Katehi et al. |
| 5,850,168 | A | 12/1998 | McVetty et al. |
| 5,926,078 | A | 7/1999 | Hino et al. |
| 5,926,079 | A | 7/1999 | Heine et al. |
| 5,929,726 | A | 7/1999 | Ito et al. |
| 5,999,070 | A | 12/1999 | Endo |
| 6,002,306 | A | 12/1999 | Arakawa et al. |
| 6,023,207 | A | 2/2000 | Ito et al. |
| 6,137,383 | A | 10/2000 | De Lillo |
| 6,154,106 | A | 11/2000 | De Lillo |
| 6,160,463 | A | 12/2000 | Arakawa et al. |
| 6,181,225 | B1 | 1/2001 | Bettner |
| 6,255,921 | B1 | 7/2001 | Arakawa et al. |
| 6,281,764 | B1 | 8/2001 | Arakawa et al. |
| 6,329,890 | B1 | 12/2001 | Brooks et al. |
| 6,351,198 | B1 | 2/2002 | Tsukamoto et al. |
| 6,437,655 | B1 | 8/2002 | Andoh et al. |
| 6,504,446 | B1 | 1/2003 | Ishihara et al. |
| 6,535,083 | B1 | 3/2003 | Hageman et al. |
| 6,549,095 | B2 | 4/2003 | Tsukamoto et al. |
| 6,559,740 | B1 | 5/2003 | Schulz et al. |
| 6,568,067 | B2 | 5/2003 | Takeda |
| 6,594,425 | B2 | 7/2003 | Tapalian et al. |
| 6,677,837 | B2 | 1/2004 | Kojima et al. |
| 6,757,963 | B2 | 7/2004 | Meier et al. |
| 6,791,403 | B1 | 9/2004 | Tayrani et al. |
| 6,801,106 | B2 | 10/2004 | Ono et al. |
| 6,834,429 | B2 | 12/2004 | Blair et al. |
| 6,844,861 | B2 | 1/2005 | Peterson |
| 6,888,973 | B2 | 5/2005 | Kolodziejski et al. |
| 6,900,150 | B2 | 5/2005 | Jacquin et al. |
| 6,909,339 | B2 | 6/2005 | Yonekura et al. |
| 6,909,345 | B1 | 6/2005 | Salmela et al. |
| 6,927,653 | B2 | 8/2005 | Uchimura et al. |
| 6,977,560 | B2 | 12/2005 | Iroh et al. |
| 6,977,566 | B2 | 12/2005 | Fukunaga |
| 7,009,470 | B2 | 3/2006 | Yatabe et al. |
| 7,068,127 | B2 | 6/2006 | Wilber et al. |
| 7,132,905 | B2 | 11/2006 | Sano |
| 7,142,074 | B2 | 11/2006 | Kim et al. |
| 7,170,373 | B2 | 1/2007 | Ito et al. |
| 7,271,686 | B2 | 9/2007 | Yoshikawa et al. |
| 7,323,954 | B2 | 1/2008 | Lee et al. |
| 7,449,979 | B2 | 11/2008 | Koh et al. |
| 7,545,235 | B2 | 6/2009 | Mansour et al. |
| 7,659,799 | B2 | 2/2010 | Jun et al. |
| 7,714,680 | B2 | 5/2010 | Vangala et al. |
| 8,008,993 | B2 | 8/2011 | Milson et al. |
| 8,072,294 | B2 | 12/2011 | Tanpo et al. |
| 8,171,617 | B2 | 5/2012 | Vangala |
| 8,284,000 | B2 | 10/2012 | Fukunaga |
| 8,314,667 | B2 | 11/2012 | Uhm et al. |
| 8,823,470 | B2 | 9/2014 | Vangala |
| 9,130,255 | B2 | 9/2015 | Rogozine et al. |
| 9,130,256 | B2 | 9/2015 | Rogozine et al. |
| 9,130,257 | B2 | 9/2015 | Vangala |
| 9,130,258 | B2 | 9/2015 | Vangala et al. |
| 2001/0024147 | A1 | 9/2001 | Arkawa et al. |
| 2002/0024410 | A1 | 2/2002 | Guglielmi et al. |
| 2003/0006865 | A1 | 1/2003 | Kim et al. |
| 2004/0000968 | A1 | 1/2004 | White et al. |
| 2004/0056737 | A1 | 3/2004 | Carpintero et al. |
| 2004/0129958 | A1 | 7/2004 | Kho et al. |
| 2004/0257011 | A1 | 12/2004 | Casey et al. |
| 2005/0057402 | A1 | 3/2005 | Ohno et al. |
| 2005/0248419 | A1* | 11/2005 | Freeman ............... H01P 5/103 333/26 |
| 2007/0120628 | A1 | 5/2007 | Jun Dong et al. |
| 2009/0015352 | A1 | 1/2009 | Goebel et al. |
| 2009/0102582 | A1 | 4/2009 | Van Der Heijden et al. |
| 2009/0146761 | A1 | 6/2009 | Nummerdor |
| 2009/0201106 | A1 | 8/2009 | Iio et al. |
| 2009/0231064 | A1 | 9/2009 | Bates et al. |
| 2010/0024973 | A1 | 2/2010 | Vangala |
| 2010/0253450 | A1 | 10/2010 | Kim et al. |
| 2011/0279200 | A1 | 11/2011 | Vangala |
| 2012/0229233 | A1 | 9/2012 | Ito |
| 2012/0286901 | A1 | 11/2012 | Vangala |
| 2013/0214878 | A1 | 8/2013 | Gorisee et al. |

FOREIGN PATENT DOCUMENTS

| | | |
|---|---|---|
| DE | 102008017967 A1 | 10/2009 |
| EP | 0322993 A2 | 7/1989 |
| EP | 0322993 A3 | 4/1990 |
| EP | 0444948 A2 | 3/1991 |
| EP | 0757401 A2 | 2/1997 |
| EP | 0859423 A1 | 8/1998 |
| EP | 1024548 A1 | 2/2000 |
| EP | 0997964 A2 | 5/2000 |

(56) References Cited

FOREIGN PATENT DOCUMENTS

| EP | 0997964 A3 | 9/2001 |
|---|---|---|
| EP | 1439599 A1 | 7/2004 |
| FR | 2318512 A1 | 2/1977 |
| JP | 62038601 | 2/1987 |
| JP | 2003298313 | 10/2003 |
| WO | 9509451 | 4/1995 |
| WO | 0024080 | 4/2000 |
| WO | 0038270 A1 | 6/2000 |
| WO | 2005091427 | 9/2005 |

OTHER PUBLICATIONS

Paul Wade: "Rectangular Waveguide to Coax Transition Design", QEX, Nov./Dec. 2006, pp. 10-17, published by American Radio Relay League, Newington, Connecticut, US.

Yoji Isota, Moriyasu Miyazaki, Osami Ishida, Fumio Takeda, Mitsubishi Electric Corporation. "A Grooved Monoblock Comb-Line Filter Suppressing the Third Harmonics", IEEE 1987 MTT-S Digest, pp. 383-386, published by IEEE, New York, New York, US.

C. Choi, Fig. 2.13, Monolithic Plated Ceramic Waveguide Filters, Mar. 31, 1986, Motorola, Inc., Schaumburg, Illinois, U.S.

Kocbach J. et al: "Design Procedure for Waveguide Filters with Cross-Couplings", 2002 IEEE MTT-S International Microwave Symposium Digest (Cat. No. 02CH37278) IEEE Piscataway, NJ, USA; IEEE MTT-S International Microwave Symposium, IEEE, Jun. 2, 2002, pp. 1449-1452, XP001113877, DOI: 10.1109/WMSYM.2002.1012128 ISBN: 978-0-8703-7239-9 abstract; figure 1.

N. Marcuvitz, Waveguide Handbook, McGraw-Hill Book Co., New York City, Ch. 5, 1951.

Y. Konishi, "Novel dielectric waveguide components-microwave applications of new ceramic materials," Proc. IEEE, vo. 79, pp. 726-740, Jun. 1991.

K. Sano, "Dielectric waveguide filter with low profile and low insertion loss," IEEE Trans. on Microwave Theory & Tech., vol. 47, pp. 2299-2303, Dec. 1999.

K. Sano and T. Yoneyama, "A transition from Microstrip to Dielectric Filled Rectangular Waveguide in Surface Mounting," IEEE MTT-S Int. Microwave Symp. Digest, pp. 813-816, 2002.

I. Awai, A.C. Kundu, and T. Yamashita, "Equivalent circuit representation and explanation of attenuation poles of a dual-mode dielectric resonator bandpass filter," IEEE Trans. Microwave Theory & Tech., vol. 46, pp. 2159-2163, Dec. 1998.

A.D. Lapidus and C. Rossiter, "Cross-coupling in microwave bandpass filters," Microwave Journal, pp. 22-46, Nov. 2004.

Tze-min Shen; Chi-Feng Chen' Huang, Ting-Yi; Wu, Ruey-Beei, "Design of Vertically Stacked Waveguide Filters in LTCC," Microwave Theory and Techniques, IEEE Transactions on, vol. 55, No. 8, pp. 1771,1779, Aug. 2007.

Hung-Yi Chien; Tze-Min Shen; Huang; Ting-Yi; Wei-Hsin Wang; Wu, Ruey-Beei, "Miniaturized Bandpass Filters with Double-Folded Substrate Integrated Resonators in LTCC," Microwave Theory and Techniques, IEEE Transactions on vol. 57, No. 7, pp. 1774, 1782, Jul. 2009.

Bo-Jiun Chen; Tze-Min Shen; Wu, Ruey-Beei, "Dual Band Vertically Stacked Laminated Waveguide Filter Design in LTCC Technology," Microwave Theory and Techniques, IEEE Transactions on, vol. 57, No. 6, pp. 1554, 1562, Jun. 2009.

Wolfram Wersing, Microwave ceramics for resonators and filters, Current Opinion in Solid State and Materials Science, vol. 1, Issue 5, Oct. 1996, pp. 715-731, ISSN 1359-0286.

Shen T et al, Full-Wave Design of Canonical Waveguide Filters by Optimation, 2001 IEEE MTT-S International Microwave Symposium Digest. (IMS 2001) Phoenix, AZ, May 20-25, 2001, pp. 1487-1490.

John David Rhodes, The Generalized Direct-Coupled Cavity Linear Phase Filter, IEEE Transactions on Microwave Theory and Techniques, vol. MTT-18, No. 6, Jun. 1, 1970 (Jun. 1, 1970), pp. 308-313, XP001401320, abstract.

* cited by examiner

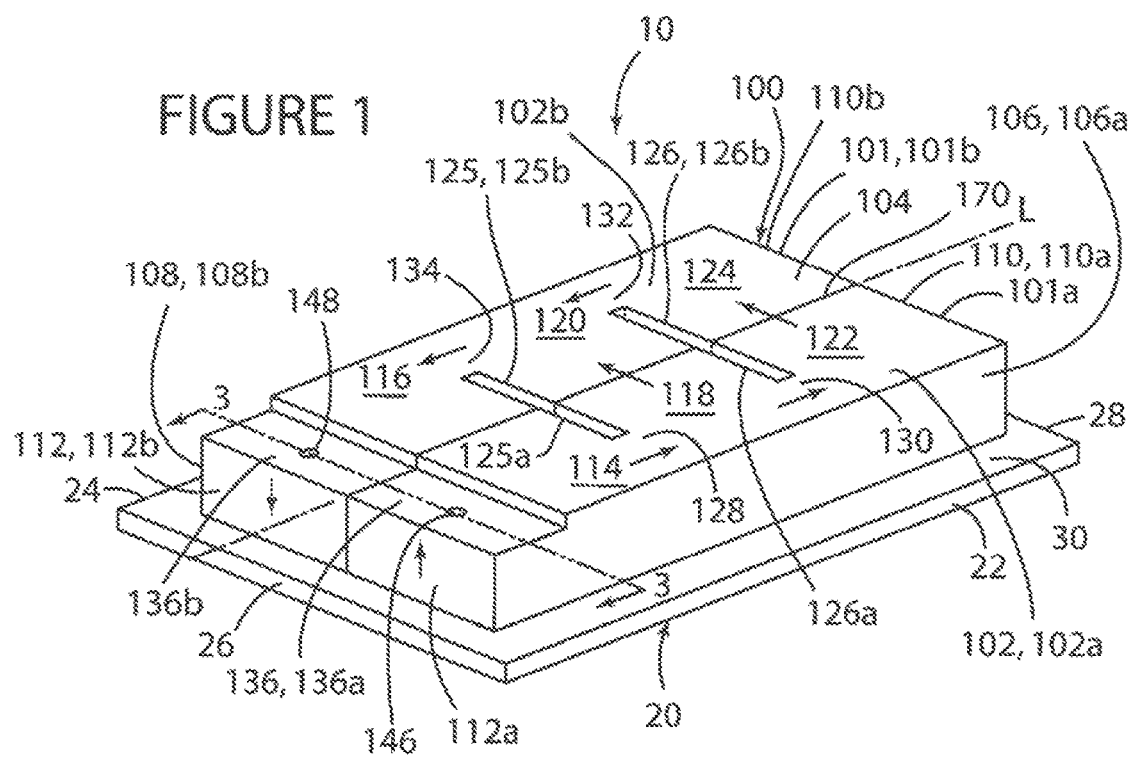

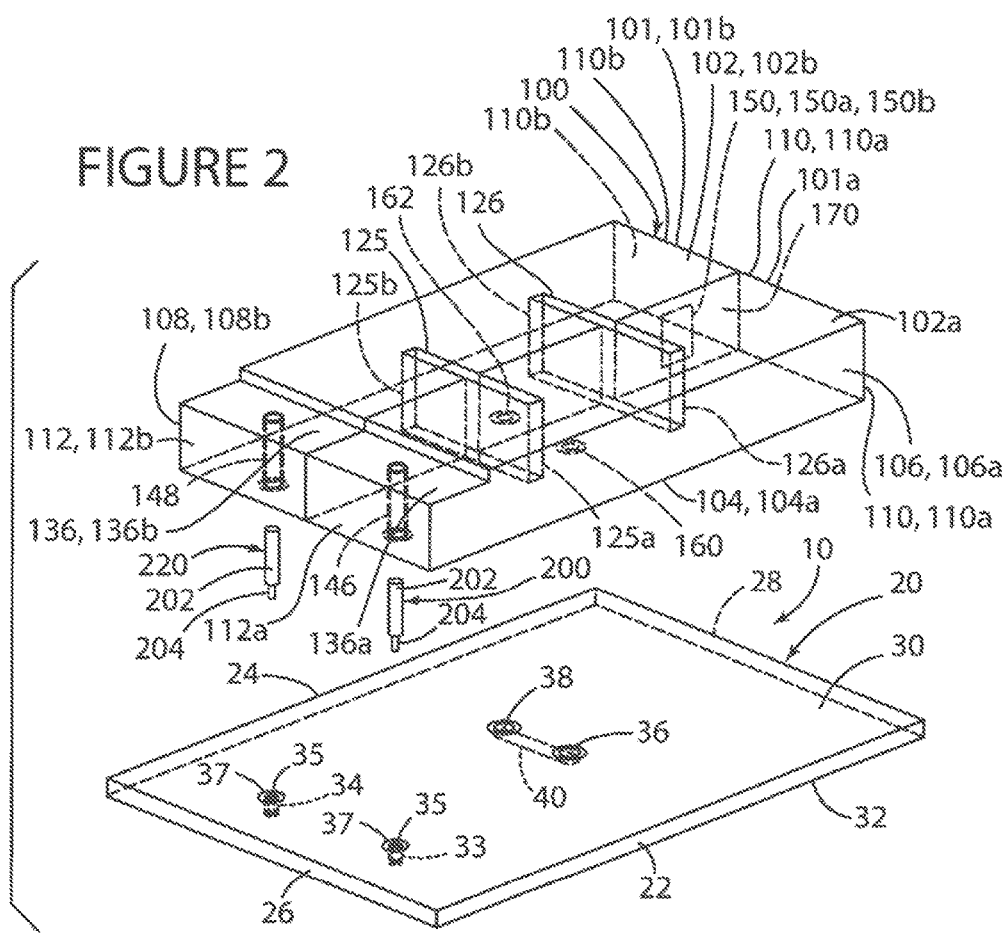
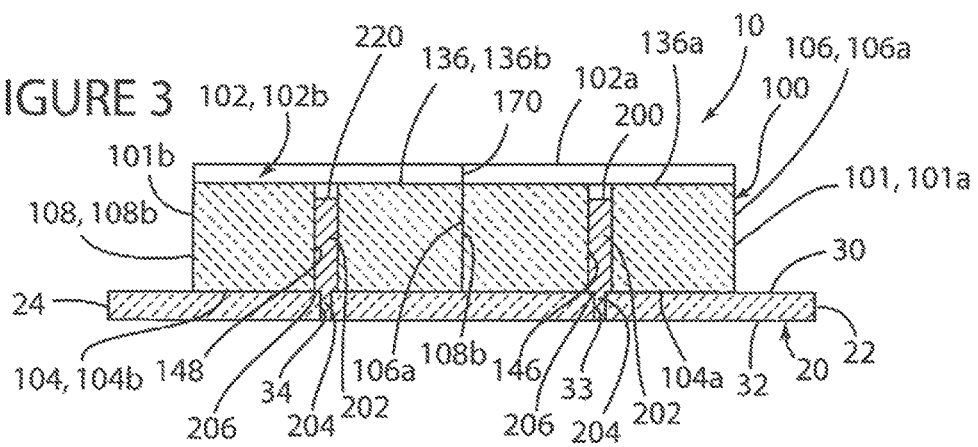

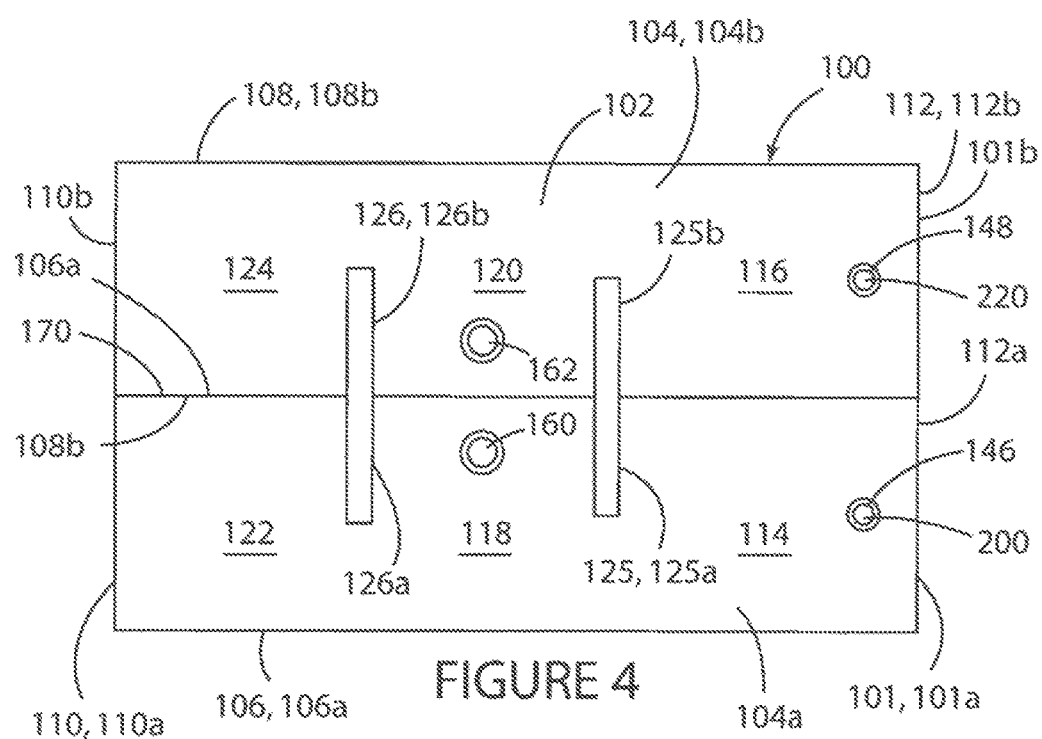
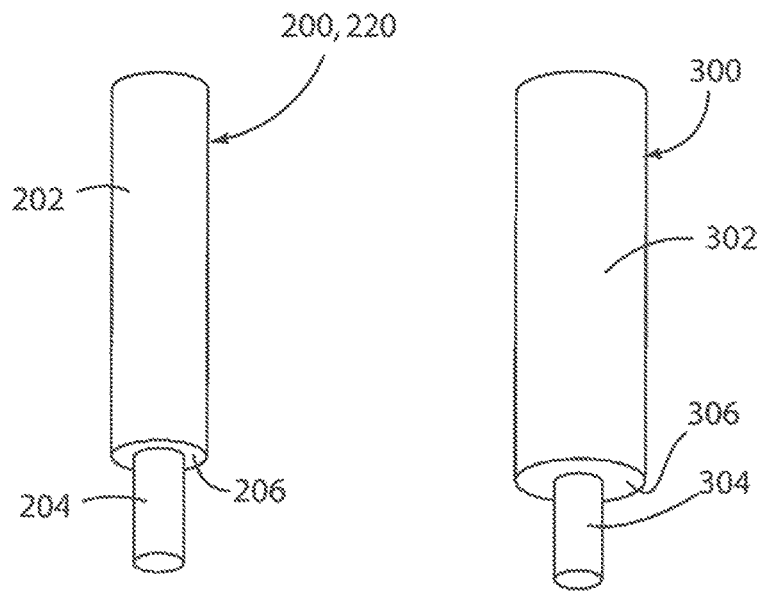
FIGURE 4
FIGURE 5          FIGURE 6

RF FILTER ASSEMBLY WITH MOUNTING PINS

CROSS-REFERENCE TO RELATED AND CO-PENDING APPLICATIONS

This application is a continuation-in part patent application which claims the benefit of the filing date of U.S. patent application Ser. No. 13/373,862 filed on Dec. 3, 2011, now U.S. Pat. No. 9,030,270 the contents of which are incorporated herein by reference as are all references cited therein.

This application also claims the benefit of the filing date and disclosure of U.S. Provisional Patent Application Ser. No. 61/975,754 filed on Apr. 5, 2014, the contents of which are incorporated herein by reference as are all references cited therein.

FIELD OF THE INVENTION

The invention relates generally to an RF filter assembly and, more specifically, to an RF dielectric waveguide filter assembly that includes an RF dielectric waveguide filter mounted on a substrate with pins.

BACKGROUND OF THE INVENTION

Radio-frequency (RF) dielectric filters including for example RF dielectric waveguide filters are typically mounted on a substrate, such as for example a printed circuit board, to form an RF dielectric filter assembly which is adapted for installation and mounting on the motherboard of a larger frequency device including for example the motherboard in the interior of a wireless communication base station.

The dielectric filter is required to be mounted on the substrate in a relationship with RF signal transmission pads on the dielectric filter in alignment with respective RF signal transmission pads on the substrate.

The present invention is directed to an RF dielectric filter assembly incorporating electrically conductive RF signal input/output transmission pins that allow for the accurate and efficient placement, alignment, and mounting of an RF dielectric filter to the substrate.

SUMMARY OF THE INVENTION

The present invention is generally directed to an RF filter assembly comprising a substrate defining at least a first substrate aperture, an RF filter mounted on the substrate and defining at least a first RF filter aperture, and an RF filter alignment and mounting pin including a first end extending into the first substrate aperture and an opposed second end extending into the first RF filter aperture.

In one embodiment, first and second ends of the pin comprise first and second elongate pin sections with different diameters adapted to be fitted into respective first substrate and RF filter apertures with different diameters.

In one embodiment, the first section of the pin has a diameter smaller than the diameter of the second section of the pin and the first substrate aperture has a diameter smaller than the diameter of the first RF filter aperture.

In one embodiment, the pin is made of a conductive metal.

The present invention is also directed to an RF waveguide filter assembly comprising a substrate including opposed top and bottom exterior surfaces and defining first and second apertures, a block of dielectric material including a plurality of exterior surfaces including top and bottom opposed exterior top and bottom surfaces, first and second through-holes extending through the block and terminating in respective openings in the top and bottom exterior surfaces of the block of dielectric material, the block of dielectric material being mounted on the substrate in a relationship with the bottom exterior surface of the block abutting against the top exterior surface of the substrate, a first pin including a first section extending into the first aperture defined in the substrate and a second section extending into the first through-hole defined in the block of dielectric material, and a second pin including a first section extending into the second aperture defined in the substrate and a second section extending into the second through-holes defined in the block of dielectric material.

In one embodiment, a step is defined at one end of the block of dielectric material, the first and second through-holes terminating in a first opening in the step and a second opening in the bottom exterior surface of the block of dielectric material.

In one embodiment, the first and second sections of each of the pins has a different diameter and defines a radial shoulder there between and abutted against the top exterior surface of the substrate.

In one embodiment, the block of dielectric material is made from a pair of separate blocks of dielectric material that have been coupled together.

In one embodiment, each of the first and second pins is made of a conductive metal.

The present invention is further directed to an RF waveguide filter assembly adapted for the transmission of an RF signal comprising a substrate defining first and second apertures and including first and second RF signal transmission pads and an internal RF signal transmission line extending between and electrically interconnecting the first and second RF signal transmission pads, an RF dielectric waveguide filter including at least first and second blocks of dielectric material mounted on the substrate, each of the first and second blocks of dielectric material defining an RF signal transmission through-hole, a first pin including a first end extending into the first aperture in the substrate and an opposed second end extending into the through-hole in the first block of dielectric material, and a second pin including a first end extending into the second aperture in the substrate and an opposed second end extending into the through-hole in the second block of dielectric material.

In one embodiment, each of the first and second blocks of dielectric material includes an end with a step defined therein, the RF signal transmission through-hole in each of the first and second blocks of dielectric material terminating in an opening in the step.

In one embodiment, the first and second blocks of dielectric material are coupled together on the substrate in a side-by-side relationship.

In one embodiment, first and second RF signal transmission pads are defined on the first and second blocks of dielectric material respectively and are in abutting relationship with the first and second RF signal transmission pads defined on the substrate.

In one embodiment, the filter assembly further comprises one or more slots defined in each of the first and second blocks of dielectric material and defining a plurality of resonators in each of the first and second blocks of dielectric material, one or more RF signal bridges defined in each of the first and second blocks of dielectric material between each pair of resonators, an internal RF signal transmission window located between a first one of the plurality of resonators in the first block of dielectric material and a first one of the plurality of resonators in the second block of dielectric material for transmitting an RF signal between the first one of the plurality of resonators in the first block of dielectric material and the first one of the plurality of resonators in the second block of dielectric material, a first RF signal transmission pad on the first block of dielectric material in abutting relationship with the first RF signal transmission pad on the substrate, and a second RF signal transmission pad on the second block of dielectric material in abutting relationship with the second RF signal transmission pad on the substrate for transmitting an RF signal between a second one of the plurality of resonators on the first block of dielectric material and a second one of the plurality of resonators on the second block of dielectric material.

Other advantages and features of the present invention will be more readily apparent from the following detailed description of the preferred embodiment of the invention, the accompanying drawings, and the appended claims.

BRIEF DESCRIPTION OF THE DRAWINGS

These and other features of the invention can best be understood by the following description of the accompanying FIGURES as follows:

FIG. 1 is an enlarged perspective view of an RF dielectric waveguide filter assembly in accordance with the present invention;

FIG. 2 is an enlarged, exploded, perspective, part phantom view of the RF dielectric waveguide filter assembly shown in FIG. 1;

FIG. 3 is an enlarged, vertical cross-sectional view of the RF dielectric waveguide filter assembly of FIG. 1 taken along the line 3-3 in FIG. 1;

FIG. 4 is an enlarged plan view of the lower surface of the RF dielectric waveguide filter of the RF dielectric waveguide filter assembly of the present invention;

FIG. 5 is an enlarged perspective view of one of the mounting pins of the RF dielectric waveguide filter assembly of the present invention; and FIG. 6 is an enlarged perspective view of another embodiment of one of the mounting pins of the RF dielectric waveguide filter assembly of the present invention.

DETAILED DESCRIPTION OF THE EMBODIMENT

FIGS. 1, 2, 3, and 4 depict one embodiment of a radio-frequency (RF) ceramic dielectric filter assembly 10 in accordance with the present invention which, in the embodiment shown, is in the form of an RF ceramic dielectric waveguide filter assembly 10.

In the embodiment shown, the RF ceramic dielectric waveguide filter assembly 10 is comprised of a substrate 20 which, in the embodiment shown, is in the form of a printed circuit board, an RF ceramic dielectric waveguide filter 100, and a pair of electrically conductive RF signal input/output transmission pins 200 and 220 adapted for aligning and mounting the RF waveguide filter 100 to the surface of the substrate 20 as described below in more detail.

The printed circuit board 20 may be of any suitable construction and, in the embodiment shown, is generally flat and rectangular in shape and includes a pair of spaced apart and parallel longitudinally extending side edges or surfaces 22 and 24, a pair of spaced apart and parallel transversely extending side edges or surfaces 26 and 28 extending between the opposed ends of the longitudinally extending side edges or surfaces 22 and 24, and upper/top and lower/bottom exterior surfaces 30 and 32.

The printed circuit board 20 also comprises and defines a pair of spaced apart and co-linear apertures or through-holes 33 and 34 (FIGS. 2 and 3) extending through the interior of the printed circuit board 20 in an orientation normal to and terminating in respective circular openings or apertures in the respective upper and lower exterior surfaces 30 and 32 of the printed circuit board 20. Although not shown in any of the FIGURES, it is understood that each of the openings in the lower exterior surface 32 is surrounded by a ring or layer of electrically conductive material which is isolated from the remainder of the printed circuit board 20 so as to define respective RF signal input/output pads on the lower exterior surface 32 of the printed circuit board 20. Each of the openings in the upper exterior surface 30 is surrounded by a region of conductive material 35 which is in turn surrounded by a region of non-conductive material 37 so as to isolate the openings and the through-holes 33 and 34 from ground.

In the embodiment shown, the through-holes 33 and 34 are positioned in a relationship adjacent, spaced from, and parallel to the transverse side edge 26 of the printed circuit board 20.

The printed circuit board 20 further comprises a pair of spaced apart and co-linear RF signal input/output pads 36 and 38 formed on the exterior upper surface 30 of the printed circuit board 20 and comprising respective layers or pads of conductive material on the exterior upper surface 30 of the printed circuit board 20 that are isolated and separated from ground. The printed circuit board 20 still further comprises an interior electrically conductive RF signal transmission line 40 that extends between and defines opposed ends in electrical contact with the pair of RF signal input/output pads 36 and 38.

In the embodiment shown, the RF signal input/output pads 36 and 38 are disposed in a co-linear and spaced apart relationship relative to each other and are centrally located on the upper surface of the printed circuit board 20 in a relationship parallel to the opposed transversely extending side edges 26 and 28 of the printed circuit board 20 and in a relationship normal to the opposed longitudinally extending side edges 22 and 24 of the printed circuit board 20.

The particular design, placement, number, and arrangement of the through-holes 33 and 34 and the pads 36 and 38 is dependent upon the particular RF application and the particular design, placement and arrangement of the RF waveguide filter 100 on the surface of the printed circuit board 20.

The RF waveguide filter 100 may be of any suitable construction including for example the construction of the RF waveguide filters disclosed in U.S. Pat. No. 8,823,470 and US Patent Application Publication No. 2012/0286901 published on Nov. 15, 2012, the entire contents and disclosures of which are incorporated herein by reference.

In the embodiment shown, the ceramic dielectric waveguide filter 100 is made from a generally rectangular shaped solid block or monoblock 101 of dielectric material, such as for example ceramic, and having opposed longitudinal upper/top and lower/bottom exterior surfaces 102 and 104 respectively, opposed longitudinal side exterior surfaces 106 and 108, and opposed transverse side exterior end surfaces 110 and 112.

The block 101 includes a plurality of resonant sections (also referred to as cavities or cells or resonators) 114, 116, 118, 120, 122, and 124 extending along the length of the block 101 and separated from each other by respective slits or slots 125 and 126 that are cut into the body of the block 101.

In the embodiment shown, the slits or slots 124 and 126 are centrally located in the block 101 and extend along the length of the block 101 in a spaced apart and parallel relationship relative to each other and in a direction and relationship generally normal to and spaced from the opposed longitudinal side exterior surfaces 106 and 108 of the block 101.

The slits 125 and 126 together define a plurality of RF signal bridges of dielectric material 128, 130, 132, and 134 in the block 101 which allow for the flow and transmission of RF signals successively through the resonators 114, 118, and 122 and the resonators 124, 120 and 116. An interior RF signal transmission window 150 is located in the Interior of the block 101 between the two end side-by-side resonators 122 and 124 and provides for the transmission of an RF signal between the resonators 122 and 124.

Thus, in the embodiment shown, the resonators 114, 118, and 122 extend successively along the block 101 in a longitudinal and co-linear relationship in which the slit 125 separates and the bridge 128 connects the resonators 114 and 118 and the slit 126 separates and the bridge 130 connects the resonators 118 and 122. The resonators 116, 120, and 124 extend successively in a longitudinal and co-linear relationship relative to each other and in a parallel and side by side relationship to the resonators 114, 118, and 122 in which: the slit 125 separates and the bridge 134 connects the resonators 116 and 120; the slit 126 separates and the bridge 132 connects the resonators 120 and 124; the end resonators 114 and 116 are disposed in a side by side relationship; the middle resonators 118 and 120 are disposed in a side by side relationship; and the opposed end resonators 122 and 124 are disposed in a side by side relationship.

In the embodiment shown, the waveguide filter 100 and, more specifically the block 101 thereof, additionally comprises and defines an end step or notch 136 comprising, in the embodiment shown, a generally L-shaped recessed or grooved or shouldered or notched region or section of the longitudinal surface 104 and opposed longitudinal side surfaces 106 and 108 of the block 101 from which dielectric ceramic material has been removed or is absent. In the embodiment shown, the step or notch 136 is located and extends through the side-by-side end resonators 114 and 116.

Further, in the embodiment shown, the waveguide fitter 100 and, more specifically, the block 101 thereof, additionally comprises first and second electrical RF signal input/output electrodes in the form of respective first and second through-holes 146 and 148 extending through the body of the block 101 in a relationship generally normal to the exterior longitudinal surfaces 102 and 104 of the block 101 and, more specifically, through the step 136 and, still more specifically, through the body of the respective end and side-by-side resonators 114 and 116 defined in the block 101 and terminating in respective openings in the exterior surface of the step 136 and the exterior surface 102 of the block 101. In the embodiment shown, the respective through-holes 146 and 148 have the same diameter and are of a diameter greater than the diameter of the respective substrate apertures 33 and 34 which are of the same diameter.

The exterior surface 102 of the block 101 also comprises and includes a pair of spaced apart and co-linear electrically conductive and isolated RF signal input/output pads or layers 160 and 162 of electrically conductive material (FIGS. 2 and 4). The pad 160 is located on the region of the exterior surface 102 of the block 101 defining the middle or interior resonator 118 and the pad 162 is located on the region of the exterior surface 102 of the block 101 defining the middle or interior resonator 120. Each of the pads 160 and 162 is surrounded by a region of dielectric material so as to isolate and separate the pads 160 and 162 from ground.

All of the external surfaces 102, 104, 106, 108, 110, and 112 of the block 101 and the internal surfaces of the input/output through-holes 146 and 148 are covered with a suitable conductive material, such as for example silver, with the exception of respective uncoated (exposed ceramic or dielectric) regions or rings on the block surface 102 which surround the openings defined in the surface 102 by the respective through-holes 146 and 148 and which surround the respective pads 160 and 162.

The block 101 still further comprises and defines an elongate layer or strip of conductive material 170 extending centrally through the interior of the block 101 in a relationship co-linear with the longitudinal axis L of the block 101. The interior layer of conductive material 170 extends the full length and height of the block 101 and is in electrical contact with the layer of conductive material that covers the respective exterior upper, lower, and side surfaces 102, 104, 110, and 112 of the block 101. The interior layer of conductive material 170 separates and electrically isolates the resonators 114, 118, and 122 from the respective side-by-side resonators 116, 120, and 124.

The interior RF signal transmission window 150 is defined by a rectangular shaped region or portion of the interior layer of conductive material 170 that is devoid of conductive material. Stated another way, the interior RF signal transmission window 150 is an interior isolated region or portion of dielectric material electrically interconnecting and coupling the respective side by side end resonators 122 and 124.

In the embodiment shown, the block 101 is made of two separate blocks 101a and 101b which have been coupled together along the central longitudinal axis L of the block 101 such as, for example, as disclosed in US Patent Application Publication No. 2012/0286901 published on Nov. 15, 2012, the entire contents and disclosure of which is incorporated herein by reference.

Thus, the block 101a is made from a generally rectangular shaped solid block 101 of any suitable dielectric material, such as for example ceramic, and having opposed upper/top and lower/bottom longitudinal exterior surfaces 102a and 104a respectively, opposed longitudinal side exterior surfaces 106a, and opposed transverse side exterior end surfaces 110a and 112a.

The block 101a includes the resonant sections (also referred to as cavities or cells or resonators) 114, 118, and 122 extending along the length of the block 101a and separated from each other by spaced-apart and parallel slits or slots 125a and 126a that are cut into the interior of the block 101a through the upper and lower exterior surfaces 102a and 104a and one of the exterior side surfaces 106a and extend in a direction transverse to the longitudinal axis and length of the block 101a.

The slits 125a and 126a together define the RF signal bridges of dielectric material 128 and 130 in the block 101a. An interior RF signal transmission window 150a is located and defined on the exterior side surface 106a in the region of the end resonator 122.

Thus, the resonators 114, 118, and 122 extend in a longitudinal and co-linear relationship on the block 101a in which the slit 125a separates and the bridge 128 connects the resonators 114 and 118 and the slit 126a separates and the bridge 130 connects the resonators 118 and 122.

The block 101a additionally comprises and defines an end step or notch 136a comprising, in the embodiment shown, a generally L-shaped recessed or grooved or shouldered or notched region or section of the longitudinal surface 102a and opposed longitudinal side surfaces 106a from which dielectric ceramic material has been removed or is absent. In the embodiment shown, the step or notch 136a is located and extends through the end resonator 114.

The block 101a also comprises the electrical RF signal input/output electrode through-hole 146 extending through the body of the block 101a in a relationship generally normal to the exterior longitudinal surfaces 102a and 104a of the block 101a and, more specifically, through the step 136a and, still more specifically, through the body of the respective end resonator 114 and terminating in an opening in the exterior surface of the step 136a and an opening in the exterior surface 104a of the block 101a respectively.

The exterior surface 102a of the block 101a also comprises and includes the electrically conductive and isolated RF signal input/output pad or layer 160 located on the region of the exterior surface 104a of the block 101a defining the middle or interior resonator 118.

All of the external surfaces 102a, 104a, 106a, 110a, and 112a of the block 101a and the internal surface of the input/output through-hole 146 are covered with conductive material with the exception of respective uncoated (exposed ceramic) regions or rings on the block surface 104a which surround the opening defined by the through-hole 146 in the exterior surface 104a of the block 101a and the region surrounding the RF signal input/output pad 160.

The block 101b is also made from a generally rectangular shaped solid block of dielectric material having opposed longitudinal exterior upper/top and lower/bottom longitudinal surfaces 102b and 104b respectively, opposed longitudinal side exterior surfaces 108b, and opposed transverse side exterior end surfaces 110b and 112b.

The block 101b includes the resonant sections (also referred to as cavities or cells or resonators) 116, 120, and 124 extending along the length of the block 101b and separated from each other by a pair of spaced-apart and parallel slits or slots 125b and 126b which are cut into the block 101b through the surfaces 102b, 104b, and one of the side surfaces 108b of the block 101b and extend in a relationship normal to the length and longitudinal axis of the block 101b.

The slits 125b and 126b together define the pair of RF signal bridges of dielectric material 132 and 134 in the block 101b. An interior RF signal transmission window 150b is defined on the one of the exterior side surfaces 108a and is located in the region of the end resonator 124.

The block 101b additionally comprises and defines an end step or notch 136b comprising, in the embodiment shown, a generally L-shaped recessed or grooved or shouldered or notched region or section of the longitudinal surface 102b and opposed longitudinal side surfaces 108b from which dielectric ceramic material has been removed or is absent. In the embodiment shown, the step or notch 136b is located and extends through the end resonator 116.

The block 101b still further comprises the electrical RF signal input/output electrode through-hole 148 extending through the body of the block 101b in a relationship generally normal to the exterior longitudinal surfaces 102b and 104b of the block 101b and, more specifically, through the step 136b and, still more specifically, through the body of the respective end resonator 116 defined in the block 101b and terminating in respective openings in the exterior surface of the step 136b and the exterior surface 104b of the block 101b.

The exterior surface 104b of the block 101b also comprises and includes the electrically conductive RF signal input/output pad or layer 162 of electrically conductive material. The pad 162 is located on the region of the exterior surface 104a of the block 101b defining the middle or interior resonator 120.

All of the external surfaces 102b, 104b, 108b, 110b, and 112b of the block 101b and the internal surface of the input/output through-hole 148 are covered with conductive material with the exception of respective uncoated (exposed ceramic) regions or rings on the block surface 104b which surround the opening defined by the through-hole 148 in the exterior surface 104b of the block 101b and surrounding the RF signal input/output pad 162.

The two blocks 101a and 102b are coupled together in a relationship in which: the exterior side surface 106a of the block 101a and the exterior surface 108b of the block 102b are abutted against each other; the slits 125a and 125b are aligned to form the slit 125; the slits 126a and 126b are aligned to form the slit 126; the steps 136a and 136b are aligned to form the step 136; and the interior RF signal transmission windows 150a and 150b are aligned to form the interior RF signal transmission window 150.

As shown in more detail in FIG. 5, each of the RF filter alignment/mounting/RF signal transmission pins 200 and 220 is elongate, generally cylindrical in shape, and may be made of any suitable conductive material including for example an unplated brass alloy 360 to improve the passive intermodulation response. Moreover, in the embodiment shown, each of the pins 200 and 220 includes an elongate cylindrical body section or end 202 and an opposed elongate cylindrical terminal section or end 204 that is unitary with the body section 202, has a diameter less than the diameter of the body section 202, and terminates in a flat radial end face. Alternatively, the terminal section or end 204 can terminate in a rounded distal tip. In the embodiment shown, the body section or end 202 is longer that the terminal section or end 202. A radial and circumferentially extending shoulder 206 is defined between the respective body and terminal sections 202 and 204 of the respective pins 200 and 220.

FIG. 6 depicts another pin embodiment 300 that includes an elongate cylindrical body section or end 302 and an opposed terminal end section 304 that is unitary with the body section 302 and has a diameter that is less than the diameter of the body section 302. In the embodiment shown, the body section 302 is longer that the terminal section 302. A radial and circumferentially extending shoulder 306 is defined between the respective body and terminal sections 302 and 304 of the pin 300.

The pin 300 differs in structure from the pins 200 and 220 in that the section 302 of the pin 300 has a larger diameter than the section 202 of the pin 200 and is adapted for use in filter assemblies that use filters with through-holes of larger diameters. The pin 300 could also be longer or shorter than the pin 200 for use in applications with filter blocks of increased or reduced height. The pin 300 is otherwise identical in structure and function to the pins 200 and 220.

The waveguide filter 100 is aligned, mounted, and secured to the upper exterior surface 30 of the printed circuit board 20 as described in more detail below.

Initially, a visual inspection is conducted to insure that all of the surfaces of the respective printed circuit board 20, waveguide filter 100, and pins 200 and 220 are clean. Next, conductive solder paste is applied to all areas which have been marked for the solder mask on the printed circuit board 20. Solder paste is then applied to each of the pins 200 and 220 and more specifically to the exterior surface of each of the sections 202 and 204 of the respective pins 200 and 220. Each of the pins 200 and 220 is then inserted and secured to the printed circuit board 20 via the insertion of the respective sections 204 of the respective pins 200 and 220 into the respective apertures 33 and 34 defined in the printed circuit board 20 into a relationship with the shoulder 206 on the respective pins 200 and 220 abutted against the exterior surface 30 of the printed circuit board 20 and the pins 200 and 220 and, more specifically, the respective body sections 202 extending generally normally outwardly and upwardly away for the exterior surface 30 of the printed circuit board 20.

The waveguide filter 100 is then initially aligned over the exterior surface 30 of the printed circuit board 20 in a relationship wherein the through-holes 146 and 148 are aligned with the respective pins 200 and 220 on the printed circuit board 20 and the RF signal transmission pads 160 and 162 on the lower exterior surface 104 of the waveguide filter 100 are aligned with the respective RF signal transmission pads 36 and 38 on the upper exterior surface 30 of the printed circuit board 20. Then, the waveguide filter 100 is lowered onto the printed circuit board 20 into a relationship wherein the bottom exterior surface 102 of the waveguide filter 100 is abutted against the exterior upper surface 30 of the printed circuit board 20; the body sections 202 of the respective pins 200 and 220 are located in and extend through the respective through-holes 146 and 148 in the waveguide filter 110; and the respective RF signal transmission pads 160 on the exterior lower surface 102 of the waveguide filter 100 are abutted against the respective RF signal transmission pads 36 and 38 on the exterior upper surface 30 of the printed circuit board 20.

Thus, in the embodiment shown, the pins 200 and 220 are oriented and positioned in the RF filter assembly 10 in a relationship normal to the longitudinal axis of the printed circuit board 20 and the waveguide filter 100 and, more specifically, in a relationship normal to the respective longitudinal upper and lower surfaces 30 and 32 of the printed circuit board 20 and the respective longitudinal upper and lower surfaces 102 and 104 of the waveguide filter 100 with the terminal section 204 located in the respective board apertures 33 and 34 and the body section 202 located in the respective waveguide filter through-holes 146 and 148; the diameters of the respective body and terminal sections 202 and 24 of the respective pins 200 and 220 and the diameters of the respective board apertures 33 and 34 are complementary and allow the respective pins 200 and 220 to be fitted into the respective board apertures and filter through-holes in a relationship with the exterior surface of the respective pins 200 and 220 in abutting relationship with the interior surface of the respective board apertures 33 and 34 and filter through-holes 146 and 148; the body sections 202 of the respective pins 200 and 220 are shorter in length than the length of the respective waveguide filter through-holes 146 and 148 or the height or thickness of the block 101; and the terminal radial end faces of the respective terminal sections 202 of the respective pins 200 and 220 are flush or even with the lower exterior surface 32 of the printed circuit board 20 so as to allow the board 20 to be seated or coupled to, for example, the motherboard of a base station in a relationship with the terminal sections of the pins 200 and 220 abutted against or in contact with the motherboard RF signal input/output pads or contacts.

Metal clips (not shown) can then be used to hold the waveguide filter 100 on the printed circuit board 20 and the assembly 10 is reflow soldered in a vapor phase machine to secure the pins 200 and 220 to the printed circuit board 20 and the filter 100 and to secure the waveguide filter 100 to the upper exterior surface 30 of the printed circuit board 20 to form and define the RF filter assembly 10.

An RF signal is adapted to be transmitted into the RF filter 10 via the RF input pad on the motherboard of a base station or the like and then through the RF filter 10 in a generally oval pattern and configuration represented by the arrows in FIG. 1 as follows: initially upwardly through the printed circuit board 20 and more specifically upwardly through the terminal section 204 of the RF signal input transmission pin 200; then upwardly through the body section 202 of the pin 200 into the end input resonator 114 and the step 136 of the waveguide filter 100; then longitudinally clockwise into the middle resonator 118 via and through the RF signal transmission bridge 12; then longitudinally clockwise into the end resonator 122 via the RF signal transmission bridge 130; then transversely into and through the end resonator 124 via and through the interior RF signal transmission window 150; then longitudinally counterclockwise into the middle resonator 120 via and through the RF signal transmission bridge 132; then longitudinally counterclockwise into the end output resonator 116 via and through the RF signal transmission bridge 134; then downwardly into the body section 202 of the RF signal output transmission pin 220; then downwardly into the terminal section 204 of the pin 220; and then downwardly into the RF signal output pad on the motherboard (not shown).

In accordance with the present invention, the use of a printed circuit board 20 with an interior RF signal transmission line 40 coupled to exterior RF signal pads 36 and 38 which are coupled to respective RF signal transmission pads 160 and 162 on the lower exterior surface 104 of the RF filter 100 allows a portion of the RF signal to be transmitted from the middle resonator 118 directly transversely from the middle interior resonator 118 into the side-by-side middle interior resonator 120.

Further, in accordance with the present invention, the use of the pins 200 and 220 allows for the efficient and accurate alignment, mounting, and placement of the filter 100 on the board 20 during the manufacturing and assembly process and, more specifically, allows for the efficient and accurate alignment of the respective RF signal transmission pads or contacts or apertures on the board 20 with the corresponding RF signal transmission pads or contacts or through-holes on the filter 100.

Although not shown in any of the FIGURES, it is understood that a similar printed circuit board interior RF transmission line and printed circuit board/filter exterior RF signal pads could be used for allowing a portion of the RF signal to be transmitted directly transversely from the end resonator 114 into the side-by-side end resonator 116.

While the invention has been taught with specific reference to the embodiment shown, it is understood that a person of ordinary skill in the art will recognize that changes can be made in form and detail without departing from the spirit and the scope of the invention. The described embodiment is to be considered in all respects only as illustrative and not restrictive.

We claim:
1. An RF filter assembly comprising:
   a substrate including opposed exterior surfaces and defining first and second substrate apertures;

an RF filter mounted on the substrate defined by first and second blocks of dielectric material that have been coupled together and defining first and second RF filter apertures defined in first and second steps respectively; and first and second RF filter alignment and mounting pins including respective first ends extending into the first and second substrate apertures respectively and respective opposed second ends extending into the respective first and second RF filter apertures defined in the first and second steps of the first and second blocks of dielectric material respectively.

2. The RF filter assembly of claim 1, wherein the first and second ends of the respective first and second pins comprise first and second elongate pin sections with different diameters adapted to be fitted into respective first and second substrate and RF filter apertures with different diameters.

3. The RF filter assembly of claim 2, wherein the first section of the first and second pins has a diameter smaller than the diameter of the second section of the first and second pins and the first and second substrate apertures have a diameter smaller than the diameter of the first and second RF filter apertures.

4. The RF filter assembly of claim 1, wherein the first and second RF filter alignment and mounting pins are made of a conductive metal.

5. An RF waveguide filter assembly comprising:
a substrate including opposed exterior surfaces and defining first and second apertures;
a block of dielectric material including a plurality of exterior surfaces including top and bottom opposed exterior surfaces, first and second through-holes extending through the block and terminating in respective openings in the top and bottom exterior surfaces of the block of dielectric material, the block of dielectric material being mounted on the substrate in a relationship with the bottom exterior surface of the block abutting against the top exterior surface of the substrate; and
a first pin including a first section extending into the first aperture defined in the substrate and a second section extending into the first through-hole defined in the block of dielectric material;
a second pin including a first section extending into the second aperture defined in the substrate and a second section extending into the second through-hole defined in the block of dielectric material; and
a step is defined at one end of the block of dielectric material, the first and second through-holes terminating in a first opening in the step and a second opening in the bottom exterior surface of the block of dielectric material.

6. The RF waveguide filter assembly of claim 5, wherein each of the first and second pins is made of a conductive metal.

7. The RF waveguide filter assembly of claim 5, wherein the first and second sections of each of the pins has a different diameter and defines a radial shoulder there between and abutted against the top exterior surface of the substrate.

8. The RF waveguide filter assembly of claim 5 wherein the block of dielectric material is made from a pair of separate blocks of dielectric material that have been coupled together.

9. An RF waveguide filter assembly adapted for the transmission of an RF signal comprising:
a substrate defining first and second apertures and including first and second RF signal transmission pads and an internal RF signal transmission line extending between and electrically interconnecting the first and second RF signal transmission pads;
an RF dielectric waveguide filter including at least first and second blocks of dielectric material mounted on the substrate, each of the first and second blocks of dielectric material defining an RF signal transmission through-hole;
a first pin including a first end extending into the first aperture in the substrate and an opposed second end extending into the through-hole in the first block of dielectric material; and
a second pin including a first end extending into the second aperture in the substrate and an opposed second end extending into the through-hole in the second block of dielectric material.

10. The RF waveguide filter assembly of claim 9, wherein each of the first and second blocks of dielectric material includes an end with a step defined therein, the RF signal transmission through-hole in each of the first and second blocks of dielectric material terminating in an opening in the step.

11. The RF waveguide filter assembly of claim 9, wherein the first and second blocks of dielectric material are coupled together on the substrate in a side-by-side relationship.

12. The RF waveguide filter assembly of claim 11, further comprising:
one or more slots defined in each of the first and second blocks of dielectric material and defining a plurality of resonators in each of the first and second blocks of dielectric material;
one or more RF signal bridges defined in each of the first and second blocks of dielectric material between each pair of resonators;
an internal RF signal transmission window located between a first one of the plurality of resonators in the first block of dielectric material and a first one of the plurality of resonators in the second block of dielectric material for transmitting the RF signal between the first one of the plurality of resonators in the first block of dielectric material and the first one of the plurality of resonators in the second block of dielectric material;
a third RF signal transmission pad on the first block of dielectric material in an abutting relationship with the first RF signal transmission pad on the substrate; and
a fourth RF signal transmission pad on the second block of dielectric material in an abutting relationship with the second RF signal transmission pad on the substrate for transmitting the RF signal between a second one of the plurality of resonators on the first block of dielectric material and a second one of the plurality of resonators on the second block of dielectric material.

13. The RF waveguide filter assembly of claim 11, further comprising third and fourth RF signal transmission pads defined on the first and second blocks of dielectric material respectively and in an abutting relationship with the first and second RF signal transmission pads defined on the substrate.

* * * * *